(12) United States Patent  
Akutsu (10) Patent No.: US 10,975,493 B2  
(45) Date of Patent: Apr. 13, 2021

(54) SINGLE CRYSTAL PRODUCTION APPARATUS AND SINGLE CRYSTAL PRODUCING METHOD

(71) Applicant: Shin Akutsu, Kodaira (JP)

(72) Inventor: Shin Akutsu, Kodaira (JP)

( * ) Notice: Subject to any disclaimer, the term of this patent is extended or adjusted under 35 U.S.C. 154(b) by 311 days.

(21) Appl. No.: 15/762,506

(22) PCT Filed: Jul. 4, 2016

(86) PCT No.: PCT/JP2016/069802  
§ 371 (c)(1),  
(2) Date: Mar. 22, 2018

(87) PCT Pub. No.: WO2017/056616  
PCT Pub. Date: Apr. 6, 2017

(65) Prior Publication Data  
US 2018/0274124 A1 Sep. 27, 2018

(30) Foreign Application Priority Data  
Oct. 1, 2015 (JP) .............................. JP2015-195534

(51) Int. Cl.
| | | |
|---|---|---|
| C30B 13/20 | (2006.01) | |
| C30B 13/22 | (2006.01) | |
| H05B 6/32 | (2006.01) | |
| C30B 29/52 | (2006.01) | |
| C30B 13/30 | (2006.01) | |
| H05B 6/06 | (2006.01) | |
| H05B 6/30 | (2006.01) | |
| H05B 6/36 | (2006.01) | |

(52) U.S. Cl.  
CPC .............. *C30B 13/20* (2013.01); *C30B 13/22* (2013.01); *C30B 13/30* (2013.01); *C30B 29/52* (2013.01); *H05B 6/067* (2013.01); *H05B 6/30* (2013.01); *H05B 6/32* (2013.01); *H05B 6/367* (2013.01)

(58) Field of Classification Search  
CPC ......... C30B 13/20; C30B 13/22; C30B 13/30; C30B 29/52; H05B 6/067; H05B 6/30; H05B 6/32; H05B 6/367  
USPC ............................................ 373/139; 117/51  
See application file for complete search history.

(56) References Cited

U.S. PATENT DOCUMENTS 4,619,811 A * 10/1986 Nishizawa .............. C30B 13/00  
117/202

FOREIGN PATENT DOCUMENTS

| JP | S 47-23301 A | 10/1972 |
|---|---|---|
| JP | 62-153186 | * 7/1987 |
| JP | 1988-274685 | * 11/1988 |
| JP | 1995-157388 | * 6/1995 |

(Continued)

OTHER PUBLICATIONS

English translation to JP201581217 (Year: 2015).*

(Continued)

*Primary Examiner* — Phuong T Nguyen  
*Assistant Examiner* — Bonita Khlok  
(74) *Attorney, Agent, or Firm* — McGinn I.P. Law Group, PLLC.

(57) ABSTRACT

To provide a single crystal production apparatus capable of efficiently producing a single crystal of relatively high quality, by cooling a melting zone, the device including: a heating part that forms the melting zone from a raw material by irradiation of light; and a supporting part that supports the melting zone in a non-contact manner.

15 Claims, 4 Drawing Sheets

(56) References Cited

FOREIGN PATENT DOCUMENTS

| JP | H 07-157388 A | 6/1995 |
|----|---------------|--------|
| JP | H 08-319191 A | 12/1996 |
| JP | 2008-239352 A | 10/2008 |
| JP | 2015-081217 A | 4/2015 |
| JP | 201581217 | * 4/2015 |

OTHER PUBLICATIONS

English translation to "JP1995-157388" (Year: 1995).*
English translation to "JP1988-274685" (Year: 1988).*
English translation to "JP 62-153186" (Year: 1985).*
International Search Report (ISR) (PCT Form PCT/ISA/210), in PCT/JP2016/069802, dated Sep. 27, 2016.

* cited by examiner

SINGLE CRYSTAL PRODUCTION APPARATUS AND SINGLE CRYSTAL PRODUCING METHOD

TECHNICAL FIELD

The present invention relates to a single crystal production apparatus and a single crystal producing method.

DESCRIPTION OF RELATED ART

Conventionally, as a method for producing a single crystal, for example, a melting zone method (floating zone method) using concentrated heating by induction heating is known (for example, Patent Document 1).

The constitution described in Patent Document 1 is as follows. First, a rod-shaped raw material is disposed in a vertically top direction (hereinafter also referred to as an upper side), and a rod-shaped seed crystal is disposed in a vertically bottom direction (hereinafter also referred to as a lower side), Then, the raw material and the seed crystal are brought close to each other. Here, a place where they are brought close to each other shall be a portion surrounded by an induction heating coil. Then, a melting zone is formed by the induction heating coil.

Since the heating capability of the induction heating coil becomes non-uniform between regions of the melted raw material (melting zone), Were is also disclosed a constitution in which a light converging and heating part for assisting the heating capability ([0008] [0014] of Patent Document 1), and thereafter, a heat reflecting region is formed on the surface of the induction heating coil, and a heat ray emitted from the light converging and heating part is reflected by the heat reflecting region to supplementarily heat the surface of the melting zone ([0014] of Patent Document 1).

PRIOR ART DOCUMENT

Patent Document

[Patent Document 1] Japanese Patent Publication No. 1995-157388

SUMMARY OF THE INVENTION

Problem to be Solved by the Invention

In Patent Document 1, a raw material rod is melted by using the heating capability of the induction heating coil to form a melting zone. In the case of using the induction heating coil, an optimum frequency of an applied power during induction heating varies depending on the type of the raw material. For example, if the raw material is a semiconductor material or metal, the frequency can be grasped.

However, when the raw material is a metal oxide, the frequency varies also depending on the degree of oxidation, and therefore the optimum frequency related to the applied power is not known. Much energy is required only by melting the semiconductor material or metal by the induction heating, and in such a situation, when the melting zone is formed from the metal oxide, the energy required for the induction heating becomes enormous. As a result, energy loss is reflected on a single crystal as a product, and the single crystal becomes expensive, resulting in a decline in competitiveness.

An object of the present invention is to propose a technique capable of efficiently producing a single crystal of relatively high quality.

Means for Solving the Problem

In order to solve the above problem, the inventors of the present invention conducted intensive studies.

First, the inventors of the present invention study whether induction heating is appropriate as a means for forming the melting zone. As described above, it is conceivable to change the means for forming the melting zone to another one, because an optimum frequency relating to the applied power is not known. For example, it is conceivable to use a melting zone method using intensive heating by an infrared lamp (for example, Japanese Patent Application Laid-Open No. 1988-274685).

However, the inventors of the present invention considered not to deny the induction heating coil as described in Patent Document 1 but to exploit its merits. Then, the inventors of the present invention reviewed again an improvement point of the melting zone method.

Whether or not the single crystal can be appropriately produced is largely related to the fact that a shape of the melting zone does not collapse and is stable. Therefore, the inventors of the present invention achieve a technique of supporting the melting zone which may collapse due to its own weight, by melt of the raw material being in charge of light, and using a so-called induction heating coil and other means that can apply a force in a direction opposite to gravity to the melting zone in a non-contact manner, instead of using the induction heating coil as the main means for melting the raw material.

Based on the abovementioned knowledge, the present invention has several aspects as follows.

A first aspect of the present invention is a single crystal production apparatus that produces a single crystal by cooling a melting zone, including:
a heating part that forms the melting zone from a raw material by irradiation of light; and
a supporting part that supports the melting zone in a non-contact manner.

A second aspect of the present invention is the device of the first aspect, further including:
a raw material grip portion that grips the raw material; and
a seed crystal grip portion that grips the seed crystal,
wherein the seed crystal grip portion is disposed at a vertically top position, and the raw material grip portion is disposed at a vertically bottom position.

A third aspect of the present invention is the device of the first aspect, further including:
the raw material grip portion that grips the raw material; and
the seed crystal grip portion that grips the seed crystal,
wherein the seed crystal grip portion is disposed at a vertical bottom position, and the raw material grip portion is disposed at a vertically top position.

A fourth aspect of the present invention is the device of any one of the first to third aspects, wherein the heating part has an infrared generating part, and the infrared generating part is disposed in a vertically top direction rather than the melting zone.

A fifth aspect of the present invention is the device of any one of the first to third aspects, wherein the heating part has a plurality of infrared generating part and has a plurality of spheroidal mirrors as reflecting parts, and the spheroidal mirrors have a common focal point in the melting zone.

A sixth aspect of the present invention is the device of any one of the first to third aspects, wherein the heating part has a plurality of infrared generating part and has a plurality of spheroidal mirrors as reflecting parts, and the spheroidal mirrors have a common focal point while the other focal point exists in the vertically top direction viewed from the common focal point, and the infrared generating part is disposed at the other focal point.

A seventh aspect of the present invention device of any one of the first to sixth aspects, wherein the supporting part supports the melting zone by electromagnetic induction.

An eighth aspect of the present invention is a single crystal producing method for producing a single crystal by cooling a melting zone, wherein the melting zone formed from a raw material by irradiation of light is supported in a non-contact manner.

Patent Document 1 describes a light converging and heating part for assisting the heating capability of the induction heating coil. However, the light converging and heating part is a supplementary means. From the word "supplementarily heat the surface of the melting zone" ([0014] of Patent Document 1), it can be considered that the light converging and heating part merely heats the melting zone and does not form the melting zone from the raw material. Currently, in a single crystal producing technology using induction heating, it is not known that each part of the single crystal production apparatus share the roles of "melting of the raw material by light" and "support of the melting zone by non-contact means" as described above.

Advantage of the Invention

According to the present invention, it is possible to efficiently produce a single crystal of relatively high quality.

DETAILED DESCRIPTION OF THE INVENTION

Hereinafter, embodiments of the present invention will be described in the following order.
1. Single Crystal Production Apparatus
   1-A) Outline of a Single Crystal Production Apparatus
   1-B) Raw Material Grip Portion
   1-C) Seed Crystal Grip Portion
   1-D) Heating Part
   1-E) Infrared Shielding Part
   1-F) Supporting Part
2. Single Crystal Producing Method
   2-A) Preparation Step
   2-B) Heating Step
   2-C) Single Crystal Growing Step
3. Effect of the Embodiment
4. Modified Example, etc.

For contents not described below, a well-known constitution in the art relating to a single crystal production apparatus by a melting zone method and a method of the same (For example, constitutions described in Japanese Patent Application Laid-Open No. 2015-081217 and 2015-081218 by the present applicant) may be adopted as appropriate.

This embodiment shows an example in which the constitution described in Japanese Patent Application Laid-open No. 2015-081217 (for example, seed crystal is disposed in the vertically top direction and the raw material is disposed in the vertically bottom direction) is mainly described. Therefore, regarding contents not described below, the contents of Japanese Patent Application Publication No. 2015-081217 are described.

Further, an example of adopting a constitution described in JP-A-2015-081218 (For example, the seed crystal is disposed in the vertically bottom direction and the raw material is disposed in the vertically top direction, that is, a constitution using a FZ, method as conventionally known), will be mentioned in <4. Modified example, etc.>.

Figure 1:
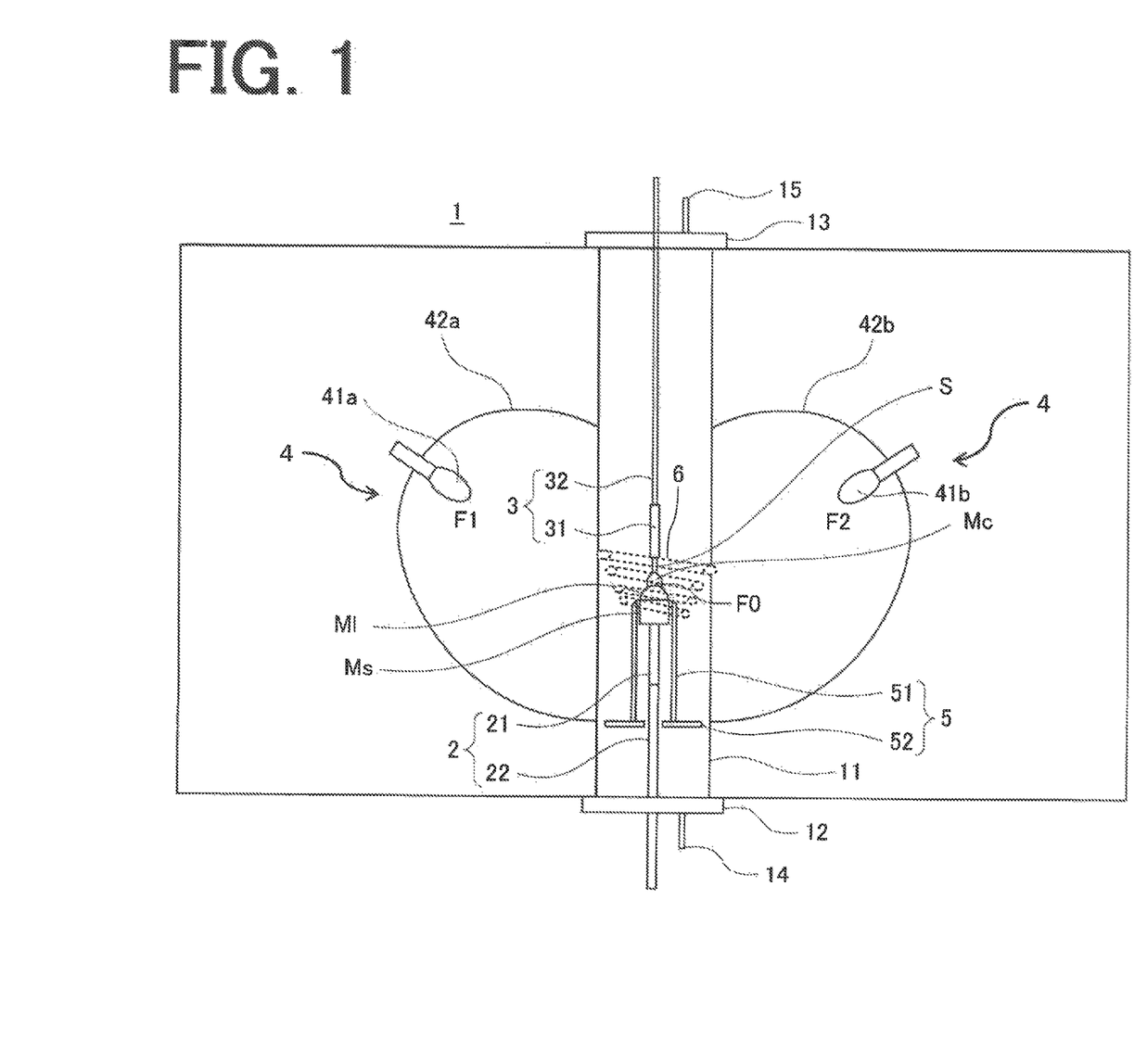
FIG. 1 is a schematic sectional view of a single crystal production apparatus according to an embodiment.
Figure 2:
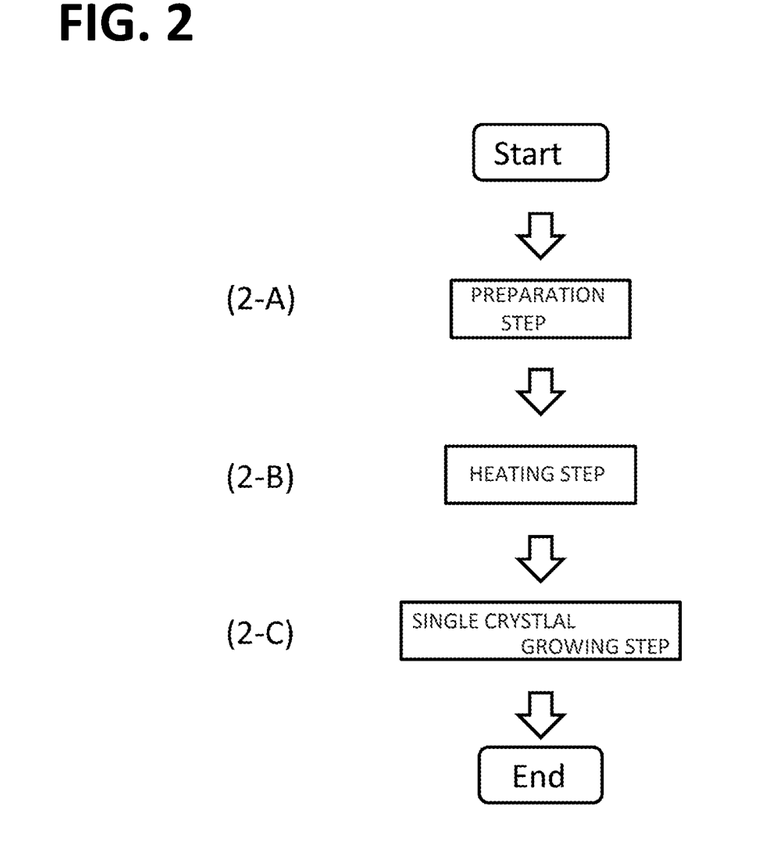
FIG. 2 is a flowchart showing a procedure of a single crystal producing method according to an embodiment.

1. Single Crystal Production Apparatus
1-A) Outline of a Single Crystal Production Apparatus A basic constitution of the single crystal production apparatus 1 according to this embodiment will be described with reference to FIGS. 1 and 2. FIG. 1 is a schematic sectional view of a single crystal production apparatus 1 according to this embodiment. FIG. 2 is a schematic plan view of an inside of the single crystal production apparatus 1 according to this embodiment.

The single crystal production apparatus 1 of this embodiment mainly has the following constitutions.

Raw material grip portion 2 freely movable in the vertical direction and rotatable around the vertical direction as the central axis A seed crystal grip portion 3 freely movable in the vertical direction and rotatable around the vertical direction as the central axis A heating part 4 that heats a raw material M gripped by the raw material grip portion 2 to melt the raw material M by irradiation of light An infrared ray shielding part 5 which freely makes a temperature gradient of the raw material M gradual from a melted portion of the raw material M toward the vertically bottom direction A supporting part 6 that supports the melting zone Ml in a non-contact manner A crystal growth furnace for growing a single crystal is sealed with a quartz furnace tube 11, and a growth atmosphere inside of the furnace is isolated from the outside, together with a lower shaft flange 12 and an upper shaft flange 13. An atmosphere with an appropriate composition is introduced into the furnace from an atmosphere introduction port 14, discharged from an atmosphere discharge port 15, so that an atmospheric component and a pressure in the furnace can be properly maintained.

This embodiment is satisfied only by providing the "heating part 4" and the "supporting part 6", but a preferable example is given here.

Further, this embodiment is greatly different from the Japanese Patent Application Laid-Open No. 2015-081217 in a point that the "supporting part 6" is provided, and descriptions of other constitutions are omitted as appropriate.

The respective constitutions listed above will be mainly described.

1-B) Raw Material Grip Portion 2

The raw material grip portion 2 of this embodiment has a constitution that is capable of gripping a solid raw material M. "Gripping a raw material" in this specification means gripping the raw material M firmly as its name implies, and is completely different from simply storing the raw material M in a crucible. Therefore, by using the expression "raw material grip portion", it is unambiguously (uniquely) derived that the crucible is not used.

In this embodiment, the raw material grip portion 2 is disposed at the position in the vertically bottom direction. By this arrangement, it is possible to completely eliminate the possibility that sag from the melting zone Ml will extend to the seed crystal S.

Further, this embodiment is also characterized by using a raw material M in a pellet form as the raw material M. In addition, this embodiment is also characterized in a point that the raw material grip portion 2 has a shape engageable with the raw material M in a pellet form. More specifically, the raw material grip portion 2 of this embodiment is composed of a "raw material holder 21" for gripping the raw material M and a "lower shaft 22" which is a rotation axis and a vertical movement axis of the raw material holder 21. The term "engagement" as used herein means a relationship in which the raw material M is fixed by a combination of the shape of the raw material holder 21 and the shape of the raw material M.

Further, the raw material grip portion 2 has a constitution that is freely movable in the vertical direction and rotatable around the vertical direction as the central axis. In this embodiment, the lower shaft 22 is the central axis. A driving source for driving the raw material grip portion 2 is not shown.

1-C) Seed Crystal Grip Portion 3

The seed crystal grip portion 3 of this embodiment has a constitution capable of gripping the seed crystal S, and has, for example, a seed crystal holder 31 and an upper shaft 32. A known constitution may be adopted for the seed crystal grip portion 3. However, one of the features of this embodiment is that the seed crystal grip portion 3 is disposed at the vertically top position, in accordance with an arrangement of the raw material grip portion 2 at the position in the vertically bottom direction. By this arrangement, it is possible to completely eliminate the possibility that sag from the melting zone Ml will extend to the seed crystal S.

The seed crystal grip portion 3 also has a constitution of being freely movable in the vertical direction and rotatable around the vertical direction as the central axis. The driving source for driving the seed crystal grip portion 3 is not shown.

1-D) Heating Part 4

The heating part 4 of this embodiment is one of the major features together with the supporting part 6 described later. In this embodiment, the heating part 4 plays a role of "melting of the raw material by light" out of the "melting of the raw material by light" and "support of the melting zone by non-contact means". By melting the solid raw material by light, it is possible to greatly reduce a required amount of energy as compared with a case of using the induction heating coil. As a result, a single crystal can be efficiently produced.

To give one specific example, the heating part 4 of this embodiment has infrared generating part 41a to 41d, and has a function of heating the raw material M gripped by the raw material grip portion 2 to melt the raw material M. Further, in addition to the infrared generating part 41, the heating part 4 of this embodiment also has reflecting parts 42a to 42d for reflecting infrared rays to the raw material M to improve irradiation efficiency.

As shown in FIG. 1, first, the spheroidal mirrors 42a and 42b as the reflecting part 42 have a common focal point F0. In addition, the spheroidal mirror 42a has a focal point F1 above the focal point F0 as the other focal point. Similarly, the spheroidal mirror 42b has a focal point F2 above the focal point F0. In this case, 41a and 41b of the infrared generating part 41a to 41d and 42a and 42b of the spheroidal mirrors 42a to 42d will be explained as examples, which are hereinafter collectively referred to as the infrared generating part 41 and the spheroidal mirrors 42.

Infrared generating part 41a and 41b are disposed at the focal points F1 and F2, respectively. The infrared heating generating part itself may adopt a known constitution. For example, a halogen lamp or a xenon arc lamp or a combination thereof may be acceptable. The common focal point F0 of the spheroidal mirrors 42 becomes a portion to be heated, and a melting zone Ml formed by bringing the melted raw material M into contact with the seed crystal S is disposed in this portion to be heated. Then, the raw material grip portion 2 and the seed crystal grip portion 3 are separated from each other to thereby cool the melting zone Ml so that the melting zone Ml is deviated from the portion to be heated, and a single crystal is grown.

Further, one of the features of this embodiment is that the infrared generating part 41 is disposed at a position in the vertically top direction (in the upper part) rather than the melting zone Ml. In other words, by constituting the infrared generating part 41 and the rotary ellipsoidal mirrors 42 so that each infrared generating part 41 is disposed above the common focal point F0 of each spheroidal mirror 42, the following effect is exhibited.

First, the lower end of the raw material M and the seed crystal S are brought into contact with each other, and the melting zone Ml is formed by heating using infrared rays. At this time, the seed crystal S is also melted. Thereafter, by increasing a distance between the raw material M and the seed crystal S and making the melting zone Ml deviated from a converging portion (F0) of the infrared rays, the seed crystal S is cooled. Because the raw material grip portion 2 is disposed below, the raw material grip portion 2 and the seed crystal grip portion 3 are relatively moved so that the portion where the single crystal is grown from the melting zone Ml (hereinafter referred to as "a growth portion Mc", and the single crystal is referred to as Mc in some cases.) moves upward.

Here, as shown in FIG. 1, when the infrared generating part 41 is disposed above the melting zone Ml, the infrared generating part 41 is also located at the upper side even if the growth portion Mc moves upward, and therefore the growth portion Mc continues to be heated to some extent. Therefore, a temperature gradient becomes gradual in the growth of the single crystal. As a result, it is possible to appropriately maintain the melting zone Ml in the raw material M, and it is possible to produce a single crystal of high quality.

Incidentally, as a specific arrangement of the infrared generating part 41, it is preferable to arrange the infrared generating part 41 at a position 15 to 45 degrees above the melting zone Ml of the raw material M, viewed from a horizontal direction.

In a case of 15 degrees or more, when the single crystal grows while the melting zone Ml moves upward, it is possible to continue heating the melting zone Ml to some extent and the temperature gradient becomes gradual. As a result, generation of crystal interface and small angle grain boundary is suppressed, and crystallinity is improved.

In a case of 45 degrees or less, it becomes possible to moderately concentrate the infrared radiation into the melting zone Ml and appropriately form and maintain the melting zone Ml.

It is more preferable to arrange the infrared generating part 41 at a position 30 to 45 degrees above. This is because in a case of 30 degrees or more, the generation of crystal interface and small angle grain boundary can be almost completely suppressed.

As shown in FIG. 2 which is a schematic plan view of an inside of the single crystal production apparatus 1 of this embodiment, in this embodiment, four spheroidal mirrors 42a to 42d are provided as the reflecting part 42. Then, the infrared generating part 41 corresponding to each of the spheroidal mirrors 42 is disposed at the vertically top position rather than the melting zone Ml and at a focal position of one (upper) of the spheroidal mirrors 42. The other (lower) focal position is the melting zone Ml. In this case, the four spheroidal mirrors 42 and the infrared generating part 41 are provided, but of course, other numbers of spheroidal mirrors 42 and infrared generating part 41 may be provided. In addition to the infrared generating part 41, the laser beam generating part may be provided below the spheroidal mirrors 42. The raw material M may be irradiated with laser beam in addition to infrared ray by the laser beam generating part. By intensively irradiating a solid phase precipitated in the melting zone Ml with laser beam using a target scope (not shown), it is also possible to partially heat the raw material M and re-dissolve the solid phase in the melting zone Ml. Thereby, stable single crystal growth becomes possible. Therefore, similarly to the spheroidal mirrors 42, the laser beam generating part may be disposed with an inclination angle formed toward the melting zone Ml. Further, as the laser beam generating part, it is possible to adopt a constitution in which an inclination angle can be arbitrarily controlled to up/down, and left/right. However, the device provided with the laser beam generating part is expensive, and therefore basically, only the infrared generating part 41 is provided, and it is preferable to provide the single crystal production apparatus 1 in which the laser beam generating part can be optionally provided.

1-E) Infrared Shielding Part 5

In this embodiment, as a more preferable constitution, the infrared ray shielding part 5 is provided, which is movable relative to the raw material grip portion 2 in the vertical direction. The infrared shielding part 5 of this embodiment has a constitution in which at least a part of the raw material M gripped by the raw material grip portion 2 can be freely enclosed in the horizontal direction, and a notch 53 is provided at the upper end of a cylindrical infrared control plate 51 which shields infrared rays emitted from the infrared generating part 41 and irradiating the raw material M. Thereby, an exposed area of the raw material M is gradually decreased from the melted portion of the raw material M toward the vertically bottom direction. In other words, the infrared rays emitted to the raw material M are gradually shielded. Thereby, the temperature gradient of the raw material M becomes gradual from the melted portion of the raw material M toward the vertically bottom direction.

As can be seen from FIG. 1, the infrared control plate 51 is disposed around the solid portion Ms of the raw material M below the melting zone Ml. The infrared control plate 51 is fixed on a floor 52 and is connected to a vertical drive mechanism (not shown). A shaft member that drives the floor 52 in the vertical direction is not shown.

1-F) Supporting Part 6

The supporting part 6 of this embodiment is one of the major features in a point that it plays a shared role together with the abovementioned heating part 4. Namely, the supporting part 6 of this embodiment plays a role of "supporting the melting zone by non-contact means". Thereby, it becomes possible to support the melting zone that may collapse due to its own weight. As a result, the shape of the melting zone can be stabilized without collapse, the single crystal can be appropriately produced, and finally, the single crystal of relatively high quality can be produced.

The supporting part 6 of this embodiment as one specific example preferably supports the melting zone Ml by electromagnetic induction. As a constitution, the supporting part 6 is preferably a separate body from the heating part 4, and in addition, the supporting part 6 preferably has an induction coil. When the supporting part 6 has the induction coil, as shown in FIG. 1, it is possible to arrange the induction coil as the supporting part 6 (broken line in the figure) so as to be wound around the melting zone Ml between the seed crystal S and the raw material M in a non-contact manner. At this time, the diameter of the induction coil is configured to decrease from the upper side to the lower side. Further, at this time, the induction coil may be wound in a non-contact manner including the infrared shielding part 5, or it may not be so. In this state, electric power is applied to the induction coil to generate a magnetic field, and a force is applied to the melting zone Ml in the direction opposite to gravity. Thereby, the shape of the melting zone can be stabilized without collapse.

For the supporting part 6, an induction heating coil described in Patent Document 1 may be adopted. However, in this embodiment, as stated repeatedly, the raw material M is not melted by the induction coil itself, but is melted by light irradiation to form the melting zone Ml. The induction coil is a means for giving a force to the melting zone Ml in the direction opposite to gravity. Therefore, the frequency of the electric power applied to the induction coil constituting the supporting part 6 can be a low value of about 10 kHz as one example. As a result, it is possible to reduce the energy required for producing the single crystal and produce the single crystal efficiently. In addition, by supporting the melting zone Ml using the supporting part 6, the melting zone Ml is less liable to collapse due to its own weight. Therefore it becomes possible to produce the single crystal of relatively high quality.

Incidentally, in the case of the constitution of this embodiment, the supporting part 6 (induction coil) exists between the infrared generating part 41 as the light source of the heating part 4 and the melting zone Ml. According to the conventional idea, in a technical field related to the production of a single crystal, the induction coil is known only as a heating application. Therefore, according to the conventional idea, it would be undesirable to provide the induction coil that is disposed to impede heating by infrared radiation. However, in this embodiment, there is a purpose of using the induction coil as the supporting part 6, and therefore the abovementioned arrangement is adopted so that the single crystal of relatively high quality can be produced.

As described above, the single crystal production apparatus 1 of this embodiment has been described. However, it goes without saying that a constitution other than those described above may be adopted as appropriate depending on the application of the single crystal production apparatus 1.

<2. Single Crystal Producing Method>

Next, an operation procedure of the single crystal production apparatus 1 of this embodiment will be described with reference to FIG. 2. FIG. 2 is a flow chart showing a procedure of the single crystal producing method of this embodiment. Regarding the contents of the following steps, there is also a part overlapping with a content described in <1. Single crystal production apparatus 1>. Therefore, regarding the contents not described below, description is made in <1. Single crystal production apparatus 1>. Further, regarding the contents not described below, a known constitution (for example, a constitution described in Japanese Patent Application Laid-Open No. 2015-081217 by the present applicant) may be appropriately adopted.

Further, in the following steps, in order to make the invention easier to understand, description will be given of a specific embodiment of each part or each means of the single crystal production apparatus 1. Of course, the present invention is not limited to one that embodies each part or each means.

2-A) Preparation Step

First, each constitution required for the single crystal production apparatus 1 is disposed as described in <1. single crystal production apparatus 1>. Further, the raw material M in a pellet form is engaged with the raw material grip portion 2 provided below, so that the rod-shaped seed crystal S is gripped by the seed crystal grip portion 3 provided above. Namely, the raw material M and the seed crystal S are disposed to face each other. Then, by bringing the raw material grip portion 2 and the seed crystal grip portion 3 close to each other, the raw material M gripped by the raw material grip portion 2 and the seed crystal S gripped by the seed crystal grip portion 3 are brought close to each other.

2-B) Heating Step

Next, in this step, the raw material M is irradiated with the infrared rays generated from the infrared generating part 41 directly and after being reflected by the spheroidal mirror 42. Then, by a direct light and a heating light converged by the spheroidal mirror 42, an upper end of the raw material M in a pellet form which is faced with the seed crystal S, is melted. A melting zone Ml is formed by bringing a slightly melted seed crystal S into contact with the incited portion.

2-C) Single Crystal Growing Step

In this step, the single crystal is grown from the melting zone Ml. At that time, "supporting step of the melting zone Ml" which is one of the features of this embodiment is performed. Specifically, electric power is applied to the induction coil in the supporting part 6. Thereby, an electromagnetic field is generated and a force is applied to the inciting zone Ml in the direction opposite to gravity. In this way, the melting zone Ml is supported so as not to collapse due to its own weight. The power is preferably 2.5 to 100 kW, and the frequency at the time of applying electric power is preferably 10 kHz to 10 MHz. Within this range, necessary energy can be moderately reduced.

By performing the above steps, a growth portion Mc in the melting zone Ml is cooled, and a single crystal having a large diameter can be formed. Then, when a predetermined amount of single crystal is formed, the production of the single crystal is completed while appropriately performing necessary work.

<3. Effect of the Embodiment>

According to this embodiment, the following effects are obtained.

As in a conventional case, when the melting zone Ml is formed by induction heating, the energy required for the induction heating becomes enormous. As a result, energy loss is reflected on the single crystal as a product, and the single crystal becomes expensive, resulting in a decline in competitiveness.

However, each part of the single crystal production apparatus shares a role of "melting of the raw material by light" and "support of the melting zone by the non-contacting means" as described above in this embodiment, to thereby making it possible to support the melting zone that may collapse due to its own weight. As a result, the energy required for producing the single crystal can be reduced and the single crystal can be efficiently produced. In addition, by supporting the melting zone Ml using the supporting part 6, the melting zone Ml is less liable to collapse due to its own weight, and therefore the single crystal of relatively high quality can be produced.

Further, even in a case of growing a multi-element crystal containing a substance with remarkably different melting points, and a crystal containing an additive with small segregation coefficient (for example, Si—Ge, Ce: LSO etc), by adopting the supporting part 6 of this embodiment, the shape of the melting zone Ml can be stabilized while maintaining the composition of the raw material charged into the melting zone Ml and the composition of the single crystal to be produced, and as a result, a large single crystal having a homogeneous composition can be produced.

Particularly in a case of Si—Ge, by providing an infrared shielding part 5 which is a preferred example, it is possible to suppress melting of only Ge having a low melting point. Therefore, as a preparation stage for preparing the single crystal of Si—Ge, a necessary amount of a necessary component in the raw material can be melted.

Further, although Si is initially incorporated into the single crystal at the time of producing the single crystal of Si—Ge, Ge is accordingly left in the melting zone Ml, and therefore Ge is increased as the composition of the inciting zone MI. In this embodiment, the raw material is changed to the melting zone Ml while producing the single crystal, and therefore finally it becomes possible to balance the quantities of Si and Ge to become the single crystal. As a result, the composition of the Si—Ge single crystal becomes homogeneous.

Besides the above effects, the following effect can be cited as the effect brought by preferred examples. Although it overlaps with the contents described in Japanese Unexamined Patent Publication No. 2015-081217, it also has an effect synergistic with the above effect, and therefore it is repeated again as appropriate.

By using the method of this embodiment, the seed crystal S is disposed at the vertically top position, and the raw material M is disposed at the vertically bottom position, and therefore it is possible to completely eliminate a possibility that sag from the melting zone Ml will extend to the seed crystal S.

Further, the following effects are exhibited by this embodiment.

(Effect 1) In the melting zone method using infrared rays, the temperature gradient of the crystal growth portion can be gradual in the growth of the single crystal, and high quality crystal growth is achieved.

(Effect 2) In the melting zone method using infrared rays, a light converging region becomes large, and it is possible to increase the diameter of the raw material and as a result increase the diameter of the single crystal after growth.

Namely, a request to improve a quality level required for the single crystal, which is a recent request, and a request to increase the size of the single crystal required for precision instruments, can be satisfied by this embodiment.

The above (effect 1) remarkably synergizes with the effect brought about by providing the supporting part 6 (for example, an induction coil) of this embodiment. More specifically, increasing the diameter of the raw material and as a result increasing the diameter of the crystal after growth means that the diameter of the melting zone Ml is increased. Then, the melting zone Ml becomes more liable to collapse due to its own weight. However, by adopting the supporting part 6 of this embodiment, the shape of the melting zone Ml does not collapse and can be stabilized. In addition, in combination with the above (effect 2), a large crystal of high quality can be produced.

Figure 3:
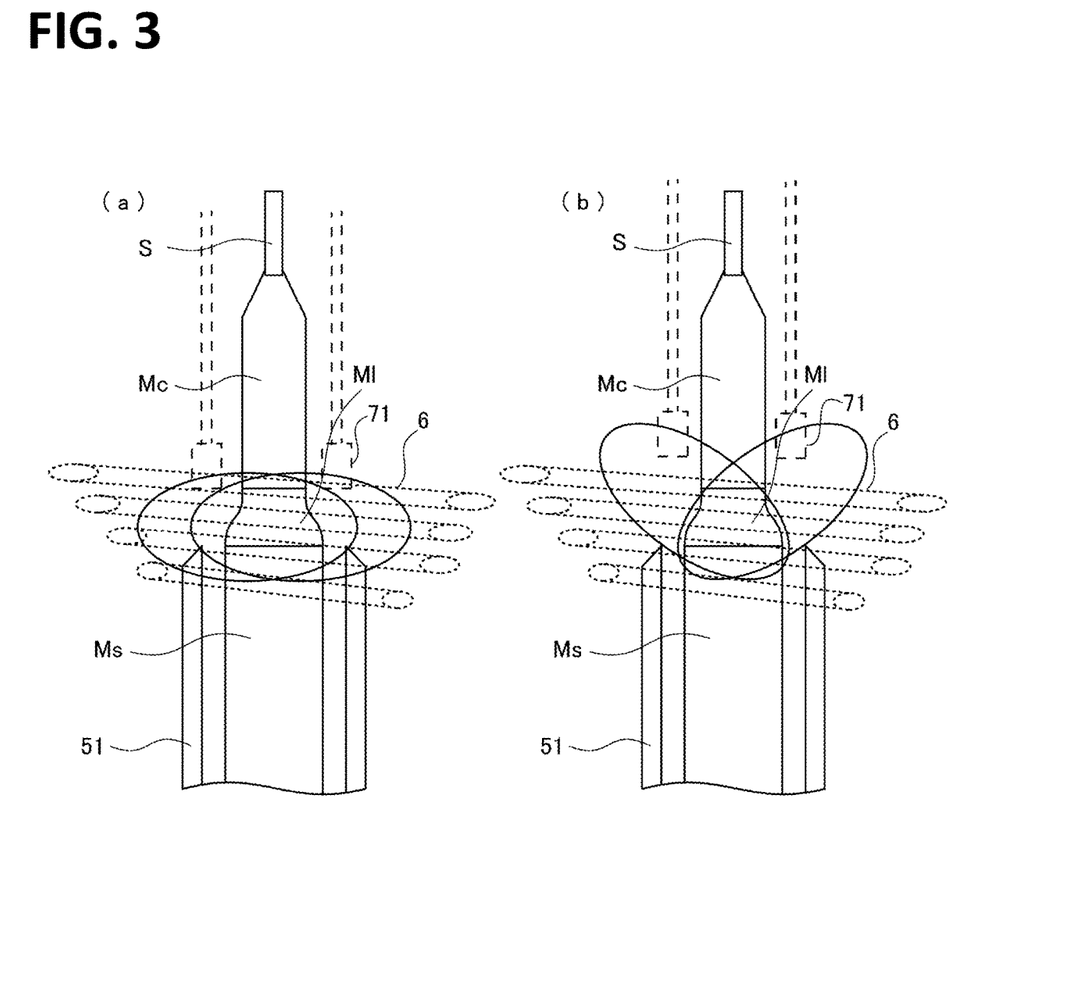
FIG. 3 is a schematic cross-sectional view showing a state of a single crystal growing step in the single crystal producing method according to an embodiment, wherein (a) is a schematic cross-sectional view when an infrared generating part is disposed at a horizontal position of a melting zone, and (b) is a schematic cross-sectional view when the infrared generating part is disposed above the melting zone.

Further, when the infrared generating part 41 is disposed above the melting zone Ml, the following effects are also exhibited. This will be described with reference to FIG. 3. FIG. 3 is a schematic cross-sectional view showing a state of a single crystal growing step in the single crystal producing method of this embodiment, wherein (a) is a schematic cross-sectional view when the infrared generating part 41 is disposed at a horizontal position of the melting zone Ml, and (b) is a schematic cross-sectional view when the infrared generating part 41 is disposed above the melting zone Ml.

When it is assumed that the spheroidal mirror 42 is horizontally disposed as shown in FIG. 3(*a*), most of the infrared rays are intercepted by the supporting part 6 (induction coil) and the infrared control plate 51. Even if a notch 53 is provided in the infrared control plate 51, it is inevitable to avoid significant reduction in the amount of infrared radiation.

In contrast, as shown in FIG. 3(*b*), when the infrared generating part 41 is disposed above the melting zone Ml, the infrared ray is hardly intercepted by the supporting part 6 (induction coil) and the infrared control plate 51. Therefore, irradiation efficiency of infrared ray can be significantly improved.

<4. Modifications etc.>

A technical scope of the present invention is not limited to the abovementioned embodiments but includes various modifications and improvements within the scope of deriving specific effects obtained by the constituent features of the invention and combinations thereof.

(Type of Single Crystal)

A technical idea of the present invention is not limited to the type of single crystal. A technical idea of the present invention can be applied to the single crystal produced by cooling the melting zone Ml. For example, as described above, a multi-element type crystal containing a substance having a significantly different melting point, and a crystal containing an additive having a small segregation coefficient (for example, Si Ge, Ce: LSO or the like) may be acceptable, and in addition, a metal or an alloy composed of crystals may be acceptable. However, as described above, in a case of metal oxide, the technical idea of the present invention exerts a further special effect as compared with a conventional technology as long as the single crystal is oxide, in consideration that the optimum frequency during induction heating is not known.

(Type of the Heating Part 4)

In the above embodiment, the case that the infrared generating part 41 is used as the light source of the heating part 4 has been described. On the other hand, anything other than the infrared generating part 41 may be used as the light source. For example, a light source of laser beam may be used for the heating part 4. The technical idea of the present invention is characterized by sharing the role of melting the raw material by the heating part 4 and supporting the melting zone Ml by the supporting part 6. As described above, when the heating part 4 is constituted by induction, energy required for melting the raw material becomes enormous in the case of the metal oxide, although a semiconductor material or a metal may be acceptable. Further, even in a case of the semiconductor material or the metal, required energy becomes large compared with a case of using light. Therefore, the type of light does not matter as long as a light source is adopted as the heating part 4. Therefore, "Light" in this embodiment refers to the lights from infrared rays to ultraviolet rays (wavelength is 1 nm to 1 mm).

(Arrangement of the Infrared Generating Part 41)

In the above embodiment, because the seed crystal S is disposed at the vertically top position and the raw material M is disposed at the vertically bottom position, it is preferable that the infrared generating part 41 is disposed in the vertically top direction rather than the melting zone Ml. However, this is merely a preferred example, and the infrared generating part 41 may be disposed at a position horizontal to the melting zone Ml or may be disposed in the vertically bottom direction rather than the melting zone Ml.

(Type of the Supporting Part 6)

In the above embodiment, a case that the induction coil is used as the supporting part 6 has been described. On the other hand, as described above, those other than the induction coil may be used as the supporting part 6. For example, any means may be used as long as it is capable of giving a force to the melting zone Ml in the direction opposite to gravity, and it is also possible to adopt a means which can give a gas pressure, an electrostatic force, a sound pressure and the like.

(Arrangement of the Seed Crystal S and the Raw Material M)

In the above embodiment, the seed crystal S is disposed at the vertically bottom position and the raw material M is disposed at the vertically top position. On the other hand, as described in Japanese Unexamined Patent Publication No. 2015-081218, the raw material grip portion 2 may be disposed at the vertically top position and the seed crystal grip portion 3 may be disposed at the vertically bottom position. In this case, an effect provided by a cooling condition adjuster 7 described in Japanese Patent Application Laid-Open No. 2015-081218 is synergistic with the effect provided by the supporting part 6. Explanation will be given below. Contents not described below, are described in Japanese Unexamined. Patent Publication No. 2015-081218, and preferred examples of at least the heating part 4 are described in the above embodiment.

Figure 4:
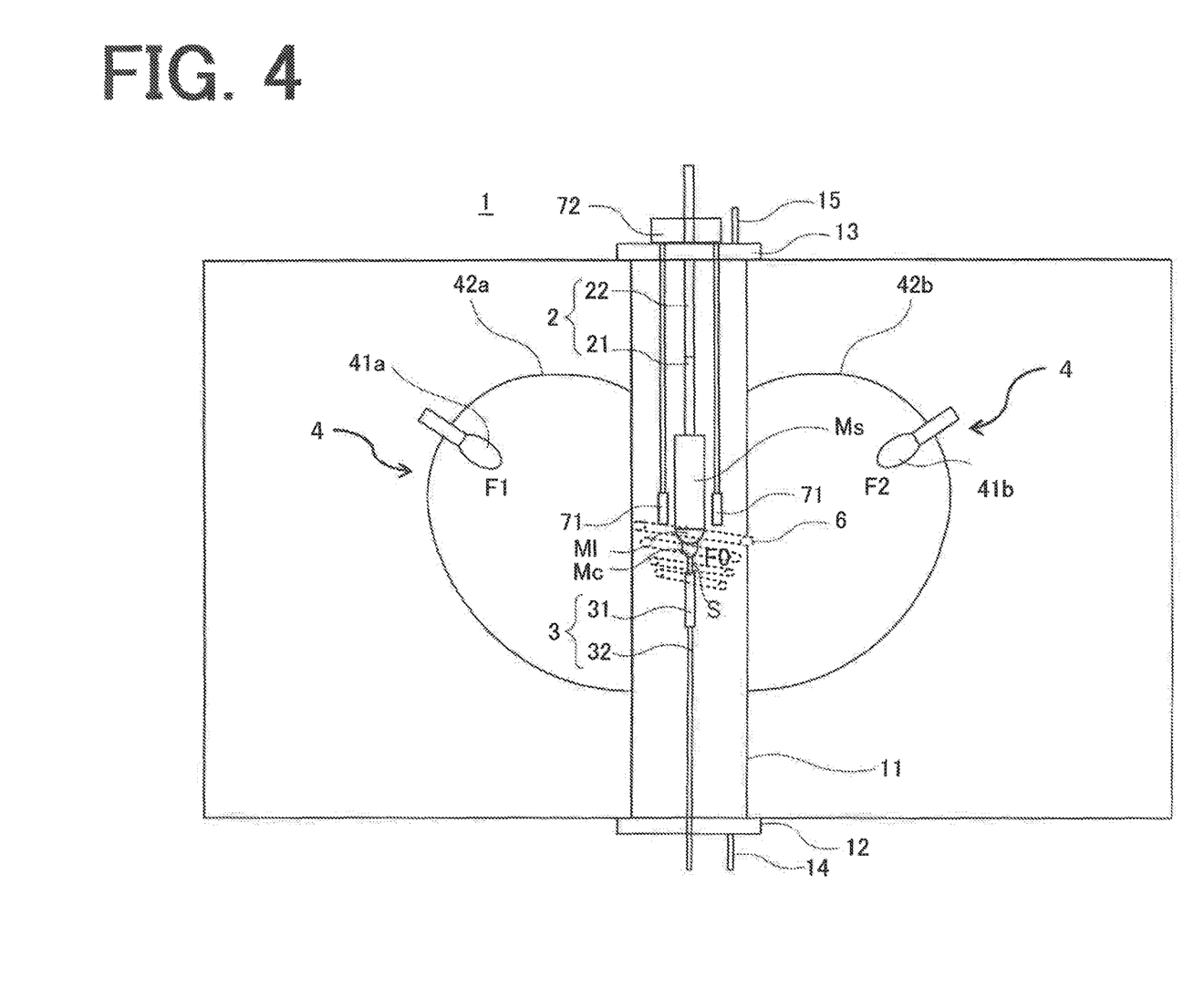
FIG. 4 is a schematic sectional view of a single crystal production apparatus according to a modified example.

As shown in FIG. 4, the cooling condition adjuster 7 includes an infrared ray shielding tube 71 connected to a driving mechanism 72 and movable in the vertical direction, and at least a part of the raw material M gripped by the raw material grip portion 2 can be freely enclosed in the shielding tube 71 in the horizontal direction, and the shielding tube 71 forms a shadow portion inside of the melting zone Ml by shielding the infrared ray radiated from the infrared generating part 41, to thereby adjust a condition of cooling in the melting zone. Owing to the presence of the cooling condition adjuster 7, it is possible to cool the melting zone MI mildly and quickly from the inside. As a result, it becomes possible to adjust a supply amount of the melted raw material, the melting zone is cooled to form a crystal, and the melting zone may be separated from the raw material. Therefore, there it is not necessary to persist the maintenance of the melting zone Ml which has been an impediment to mild heating and cooling.

In addition, the shape of the melting zone Ml can be stabilized by the supporting part 6 without collapse. Namely, it is possible to suppress the collapse of the shape of the melting zone Ml in a two-stage stance of the supporting part 6 and the cooling condition adjuster 7.

As a result, particularly when a crystal of a multi-element system listed above or a crystal containing an additive having a small segregation coefficient (for example, Si—Ge or Ce: LSO or the like) is grown, it is possible to more reliably produce a large single crystal having a homogeneous composition.

Each of the abovementioned modified examples may be applied to the abovementioned embodiment, and an appropriate combination of each of them may be applied to the abovementioned embodiment.

For example, in the constitution described in Japanese Patent Publication No. 2015-081217 in which the seed crystal is disposed in the vertically top direction and the raw material is disposed in the vertically bottom direction, it is preferable to further provide the cooling condition adjuster 7 (the shielding tube 71 shown by a broken line in FIG. 3) above the infrared shielding portion 5, for the melting zone Ml, in addition to the infrared shielding portion 5, because the effect by the infrared shielding part 5 and the cooling condition adjuster 7 can be obtained. However, conversely, even if neither the infrared shielding part 5 nor the cooling condition adjuster 7 is provided, the effect of the present invention can be obtained as long as the heating part 4 and the supporting part 6 of this embodiment are provided.

Even in a case of a constitution without providing the cooling condition adjuster 7 or a constitution using a conventional PZ method in the constitution described in Japanese Patent Application Laid-Open No. 2015-081218 in which the seed crystal is disposed in the vertically bottom direction and the raw material is disposed in the vertically top direction, the effect of the present invention is achieved as long as the heating part 4 and the supporting part 6 of this embodiment are provided.

DESCRIPTION OF SIGNS AND NUMERALS

1 Single crystal production apparatus
   11 Quartz furnace tube
   12 Lower shaft flange
   13 Upper shaft flange
   14 Atmosphere introduction port
   15 Atmosphere discharge port
2 Raw material grip portion.
   21 Raw material holder
   22 Lower shaft
3 Seed crystal grip portion.
   31 Seed crystal holder
   32 Upper shaft
4 Heating part
   41 Infrared generating part
   42 Reflecting part
5 Infrared ray shielding part
   51 Infrared ray control plate
   52 Floor
   53 Notch
6 Supporting part (induction coil)
7 Cooling condition adjuster
   72 Shielding tube
   72 Driving mechanism
M Raw material
   Ms Solid portion
   Ml Melting zone
   Mc Growth portion single crystal)
S Seed crystal

The invention claimed is:

1. A single crystal production apparatus that produces a single crystal by cooling a melting zone, the single crystal production apparatus comprising:
a raw material grip that grips a raw material;
a seed crystal grip that grips a seed crystal;
a heater that forms the melting zone from the raw material by irradiation of light;
an induction coil disposed around the melting zone and supporting the melting zone in a non-contact manner,
wherein the seed crystal grip is disposed at a position in a vertically bottom direction, and the raw material grip is disposed at a position in a vertically top direction,
wherein a diameter of the induction coil becomes smaller from the vertically top direction to the vertically bottom direction,
wherein the heater includes a plurality of infrared generators and a plurality of spheroidal mirrors as reflectors, the spheroidal mirrors having a common focal point and an other focal point in the vertically top direction viewed from the common focal point, and an infrared generator of the infrared generators being disposed at the other focal point;
an infrared ray shielding tube, connected to a driving mechanism, to adjust the cooling in the melting zone to form the single crystal; and
an atmosphere introduction port and an atmosphere discharge port to control pressure in a furnace for growing the single crystal, a lower shaft flange and an upper shaft flange isolating the furnace from outside.

2. A single crystal producing method for producing a single crystal by cooling a melting zone, the single crystal producing method comprising:
arranging an induction coil around the melting zone formed from a raw material by irradiation of light in a state of gripping a seed crystal at a position in a vertically bottom direction and gripping the raw material at a position in a vertically top direction, so that a diameter of the induction coil becomes smaller from the vertically top direction to the vertically bottom direction;
supporting the melting zone by the induction coil in a non-contact manner, wherein a plurality of infrared generators and a plurality of spheroidal mirrors as reflectors provide the irradiation of light, the spheroidal mirrors having a common focal point and an other focal point in the vertically top direction viewed from the common focal point, and an infrared generator of the infrared generators being disposed at the other focal point;
adjusting the cooling in the melting zone to form the single crystal by an infrared ray shielding tube connected to a driving mechanism; and
controlling pressure in a furnace by an atmosphere introduction port and an atmosphere discharge port, for growing the single crystal, a lower shaft flange and an upper shaft flange isolating the furnace from outside.

3. The single crystal production apparatus according to claim 1, further comprising:
a quartz furnace tube that seals a growth atmosphere from outside of the quartz furnace tube.

4. The single crystal production apparatus according to claim 3, wherein the induction coil is disposed inside of the quartz furnace tube.

5. The single crystal production apparatus according to claim 3, wherein, in a radial direction of the quartz furnace tube, the induction coil is disposed between the inciting zone and the quartz furnace tube.

6. The single crystal production apparatus according to claim 1, wherein the spheroidal mirrors have a second focal point in the vertically top direction viewed from the common focal point, another infrared generator of the infrared generators being disposed at the second focal point.

7. The single crystal production apparatus according to claim 1, wherein, with respect to a horizonal line that passes through the melting zone, the infrared generators are located above the melting zone in the vertically top direction.

8. The single crystal production apparatus according to claim 1, wherein the diameter of the induction coil increases in the vertically bottom direction as the induction coil extends toward the infrared generators.

9. The single crystal production apparatus according to claim 1, wherein the diameter of the induction coil in a side of the infrared generators is more than the diameter of the induction coil in a side of the seed crystal grip.

10. The single crystal production apparatus according to claim 1, wherein, with respect to a horizonal line that passes through the melting zone, the other focal point is located above the common focal point.

11. The single crystal production apparatus according to claim 1, wherein each of the infrared generators is disposed above the common focal point of each of the spheroidal mirrors.

12. The single crystal production apparatus according to claim 1, wherein, with respect to a horizonal line that passes through the melting zone, the infrared generator of the infrared generators is located higher than the common focal point of each of the spheroidal mirrors.

13. The single crystal production apparatus according to claim 1, wherein, with respect to a horizonal line that passes through the melting zone, the infrared generator of the infrared generators is located higher than the melting zone.

14. The single crystal production apparatus according to claim 1, wherein, with respect to a horizonal line that passes through the melting zone, each of the infrared generators is located higher than the melting zone.

15. The single crystal production apparatus according to claim 1, wherein the infrared generators are located in a range from 15 degrees to 45 degrees above the melting zone as viewed from a horizontal direction.

* * * * *